(12) United States Patent
Shida et al.

(10) Patent No.: US 7,560,384 B2
(45) Date of Patent: Jul. 14, 2009

(54) CHEMICAL MECHANICAL POLISHING METHOD

(75) Inventors: Hirotaka Shida, Chuo-ku (JP); Masayuki Hattori, Yatomi (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/358,224

(22) Filed: Feb. 22, 2006

(65) Prior Publication Data
US 2006/0186089 A1 Aug. 24, 2006

(30) Foreign Application Priority Data
Feb. 23, 2005 (JP) ............... 2005-046374

(51) Int. Cl.
*H01L 21/302* (2006.01)
(52) U.S. Cl. ............ 438/692; 438/693; 451/34; 216/89
(58) Field of Classification Search .......... 438/692, 438/693; 451/34; 216/89
See application file for complete search history.

(56) References Cited

U.S. PATENT DOCUMENTS

| 5,858,813 | A | 1/1999 | Scherber et al. | |
|---|---|---|---|---|
| 6,935,928 | B2 | 8/2005 | Uchikura et al. | |
| 7,067,427 | B2* | 6/2006 | Tsuchiya et al. | 438/691 |
| 2004/0082274 | A1* | 4/2004 | Leng | 451/41 |
| 2004/0248412 | A1* | 12/2004 | Liu et al. | 438/689 |
| 2005/0153560 | A1* | 7/2005 | Enomoto | 438/692 |

FOREIGN PATENT DOCUMENTS

| CN | 1540741 A | 10/2004 |
|---|---|---|
| CN | 1550538 A | 12/2004 |
| EP | 1 152 046 A1 | 11/2001 |
| JP | 10-44047 | 2/1998 |
| JP | 10-163141 | 6/1998 |
| JP | 2000-160141 | 6/2000 |

OTHER PUBLICATIONS

U.S. Appl. No. 11/433,508, filed May 15, 2006, Uchikura, et al.
U.S. Appl. No. 11/369,870, filed Mar. 8, 2006, Uchikura, et al.
U.S. Appl. No. 12/127,334, filed May 27, 2008, Kunitani, et al.
U.S. Appl. No. 12/097,361, filed Jun. 13, 2008, Ikeda, et al.
U.S. Appl. No. 12/295,673, filed Oct. 1, 2008, Uchikura, et al.
U.S. Appl. No. 12/295,872, filed Oct. 3, 2008, Takemura, et al.
U.S. Appl. No. 12/297,949, filed Oct. 21, 2008, Namie, et al.
U.S. Appl. No. 12/374,074, filed Jan. 16, 2009, Andou, et al.

* cited by examiner

*Primary Examiner*—Binh X Tran
(74) *Attorney, Agent, or Firm*—Oblon, Spivak, McClelland, Maier & Neustadt, P.C.

(57) ABSTRACT

A chemical mechanical polishing method, including: chemically and mechanically polishing a polishing target surface by continuously performing a first polishing step and a second polishing step having a polishing rate lower than a polishing rate of the first polishing step, a chemical mechanical polishing aqueous dispersion used in the first polishing step and the second polishing step being a mixture of an aqueous dispersion and an aqueous solution, and the polishing rate being changed between the first polishing step and the second polishing step by changing a mixing ratio of the aqueous dispersion and the aqueous solution.

6 Claims, 2 Drawing Sheets

CHEMICAL MECHANICAL POLISHING METHOD

Japanese Patent Application No. 2005-46374, filed on Feb. 23, 2005, is hereby incorporated by reference in its entirety.

BACKGROUND OF THE INVENTION

The present invention relates to a chemical mechanical polishing method. More particularly, the invention relates to a chemical mechanical polishing method capable of efficiently removing an unnecessary wiring material and providing a high-quality polished surface when manufacturing a semiconductor device using copper or a copper alloy as the wiring material.

In recent years, a further increase in the degree of integration has been demanded for a semiconductor device, and scaling down of wirings formed in a semiconductor device has progressed. A damascene method has attracted attention as a technology capable of achieving further scaling down of wirings of a semiconductor device. In the damascene method, a desired wiring is formed by filling a groove formed in an insulating material with a metal material which forms a wiring and removing an unnecessary wiring material by chemical mechanical polishing. In the damascene method, a high polishing rate is required from the viewpoint of an increase in efficiency and throughput of the polishing step.

A wiring may be polished excessively when forming a damascene wiring, whereby the wiring may have a concave shape. Such a concave wiring shape is called "dishing" or "erosion" and results in a decrease in the yield of semiconductor devices. A surface defect called a "scratch" may also occur during polishing and result in a decrease in the yield of semiconductor devices.

There may be a case where abrasives remaining on the wiring or foreign matter remaining on the insulating film causes a problem after the chemical mechanical polishing step. Or, a phenomenon called "corrosion" in which the wiring is corroded may also occur. This also significantly affects the yield of semiconductor devices.

Various chemical mechanical polishing aqueous dispersions have been proposed in order to reduce occurrence of dishing or erosion to improve the planarity of the polished surface or to reduce occurrence of a scratch or corrosion.

For example, JP-A-10-163141 discloses that a composition containing abrasives, water, and an iron compound has an effect of reducing occurrence of dishing. JP-A-2000-160141 discloses that a composition containing abrasives, a-alanine, hydrogen peroxide, and water is effective for reducing occurrence of dishing and erosion to provide a polished surface exhibiting excellent planarity. JP-A-10-44047 discloses that the planarity of the polished surface is improved by adding a surfactant to a chemical mechanical polishing aqueous dispersion.

In the chemical mechanical polishing step, a high polishing rate is required in addition to improving the planarity of the polished surface and reducing occurrence of surface defects. However, few studies have been conducted on a chemical mechanical polishing aqueous dispersion which can achieve these requirements in combination.

SUMMARY

The invention may provide a chemical mechanical polishing method capable of providing a high-quality polished surface which exhibits excellent planarity and in which occurrence of surface defects is reduced, and achieving a high polishing rate.

The above problems can be solved by the chemical mechanical polishing method according to one aspect of the invention.

According to one aspect of the invention, there is provided a chemical mechanical polishing method, comprising:

chemically and mechanically polishing a polishing target surface by continuously performing a first polishing step and a second polishing step having a polishing rate lower than a polishing rate of the first polishing step, a chemical mechanical polishing aqueous dispersion used in the first polishing step and the second polishing step being a mixture of an aqueous dispersion (I) and an aqueous solution (II), and the polishing rate being changed between the first polishing step and the second polishing step by changing a mixing ratio of the aqueous dispersion (I) and the aqueous solution (II).

In this chemical mechanical polishing method, the aqueous dispersion (I) may include (A) abrasives and (B) quinolinic acid;

the aqueous solution (II) may include (C) a polishing rate improver; and when amounts of the aqueous dispersion (I) and the aqueous solution (II) supplied in the first polishing step are respectively denoted by S(I-1) and S(II-1) and amounts of the aqueous dispersion (I) and the aqueous solution (II) supplied in the second polishing step are respectively denoted by S(I-2) and S(II-2), "S(I-1)/S(II-1)<S(I-2)/S(II-2)" may be satisfied.

In this chemical mechanical polishing method,
the aqueous dispersion (I) may further include (D) an oxidizing agent.

In this chemical mechanical polishing method,
the aqueous solution (II) may further include (D) an oxidizing agent.

In this chemical mechanical polishing method,
the aqueous dispersion (I) may include (A) abrasives and (D) an oxidizing agent;
the aqueous solution (II) may include (B) quinolinic acid; and when amounts of the aqueous dispersion (I) and the aqueous solution (II) supplied in the first polishing step are respectively denoted by S(I-1) and S(II-1) and amounts of the aqueous dispersion (I) and the aqueous solution (II) supplied in the second polishing step are respectively denoted by S(I-2) and S(II-2), "S(I-1)/S(II-1)<S(I-2)/S(II-2)" may be satisfied.

In this chemical mechanical polishing method,
the aqueous dispersion (I) may include (A) abrasives and (B') a compound having a heterocyclic ring (excluding quinolinic acid);
the aqueous solution (II) may include (C) a polishing rate improver and (D) an oxidizing agent; and when amounts of the aqueous dispersion (I) and the aqueous solution (II) supplied in the first polishing step are respectively denoted by S(I-1) and S(II-1) and amounts of the aqueous dispersion (I) and the aqueous solution (II) supplied in the second polishing step are respectively denoted by S(I-2) and S(II-2), "S(I-1)/S(II-1)<S(I-2)/S(II-2)" may be satisfied.

In this chemical mechanical polishing method,
the aqueous dispersion (I) may include (A) abrasives, (B') a compound having a heterocyclic ring (excluding quinolinic acid), and (D) an oxidizing agent;
the aqueous solution (II) may include (C) a polishing rate improver; and when amounts of the aqueous dispersion (I) and the aqueous solution (II) supplied in the first polishing step are respectively denoted by S(I-1) and S(II-1) and amounts of the aqueous dispersion (I) and the aqueous solution (II) supplied in the second polishing step are respectively denoted by S(I-2) and S(II-2), "S(I-1)/S(II-1)<S(I-2)/S(II-2)" may be satisfied.

According to this chemical mechanical polishing method, a high-quality polished surface which exhibits excellent planarity and in which occurrence of surface defects is reduced can be obtained, and a high polishing rate can be achieved.

DETAILED DESCRIPTION OF THE EMBODIMENT

1. Chemical Mechanical Polishing Method

According to one embodiment of the invention, there is provided a chemical mechanical polishing method, comprising chemically and mechanically polishing a polishing target surface by continuously performing a first polishing step and a second polishing step having a polishing rate lower than a polishing rate of the first polishing step, a chemical mechanical polishing aqueous dispersion used in the first polishing step and the second polishing step being a mixture of an aqueous dispersion (I) and an aqueous solution (II), and the polishing rate being changed between the first polishing step and the second polishing step by changing a mixing ratio of the aqueous dispersion (I) and the aqueous solution (II).

Figure 1A:
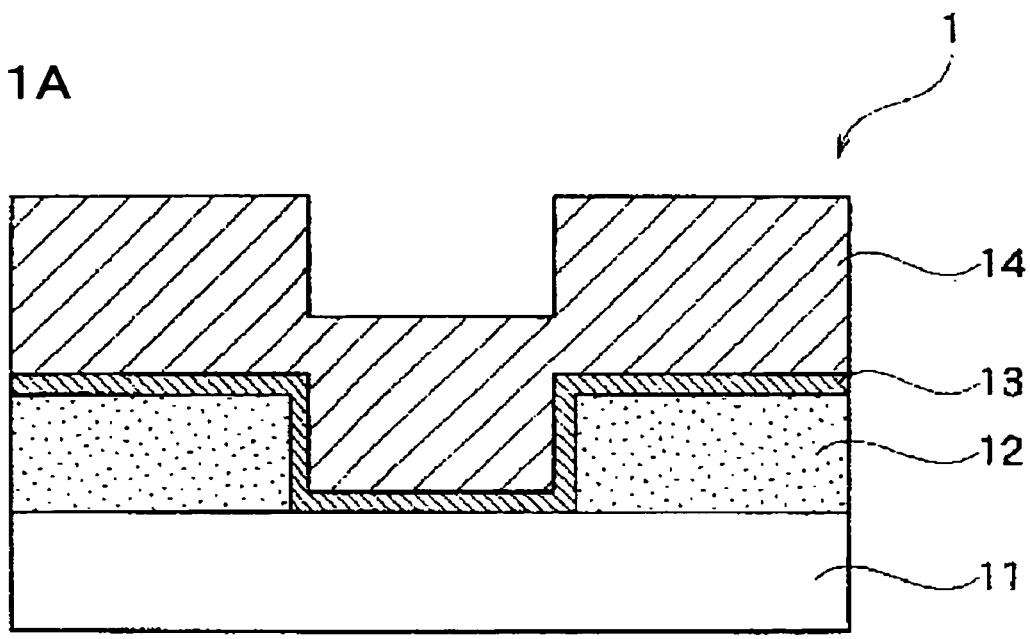
FIGS. 1A to 1C are cross-sectional views schematically showing a chemical mechanical polishing method according to one embodiment of the invention.

The chemical mechanical polishing method according to one embodiment of the invention fully exerts its advantageous effects when removing an unnecessary metal wiring material in a step of manufacturing a semiconductor device by the damascene method. As an example of the polishing target of the chemical mechanical polishing method according to one embodiment of the invention, a composite substrate material 1 having a structure as shown in FIG. 1A can be given. The composite substrate material 1 includes a substrate 11 formed of silicon or the like, an insulating film 12 which is stacked on the surface of the substrate 11 and in which a depression for wiring such as a groove is formed, a barrier metal film 13 provided to cover the surface of the insulating film 12 and the bottom and the inner wall of the depression for wiring, and a metal film 14 formed of a wiring material provided in the depression for wiring and formed on the barrier metal film 13.

Figure 2A:
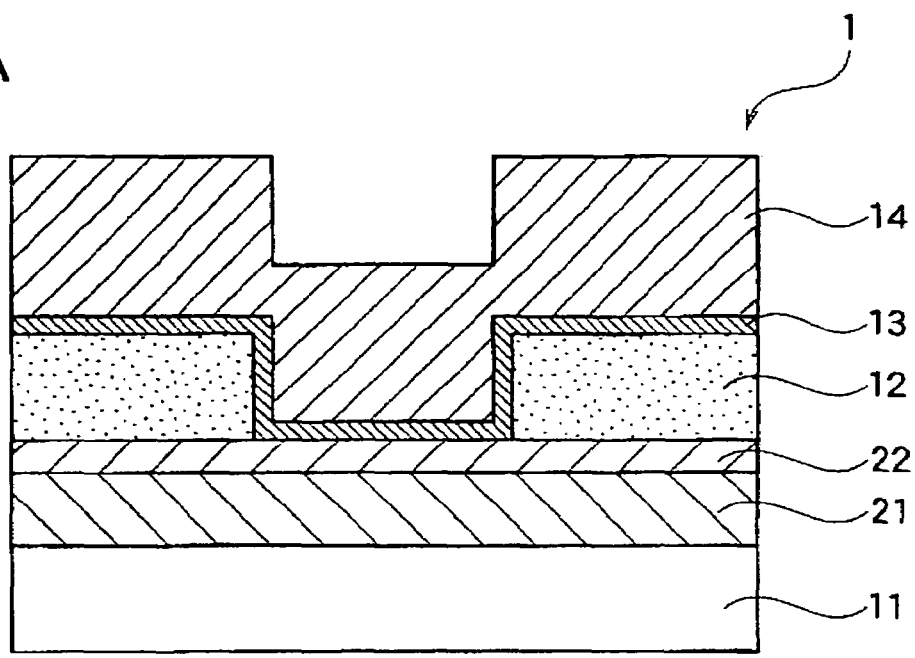
FIGS. 2A to 2C are cross-sectional views schematically showing a chemical mechanical polishing method according to one embodiment of the invention.

As shown in FIG. 2A, the polishing target of the chemical mechanical polishing method according to one embodiment of the invention may include an insulating film 21 provided between the substrate 11 and the insulating film 12 and formed of silicon oxide or the like, and an insulating film 22 formed of silicon nitride or the like on the insulating film 21.

As examples of the metal used as the wiring material, tungsten, aluminum, copper, and an alloy containing such a metal can be given. The chemical mechanical polishing method according to one embodiment of the invention fully exerts its effects when using copper or a copper alloy as the wiring material. The copper content in the copper alloy is preferably 95 wt % or more.

As examples of the barrier metal, tantalum, tantalum nitride, titanium, titanium nitride, an tantalum-niobium alloy, and the like can be given.

As examples of the insulating film, a silicon oxide film formed by a vacuum process (e.g. plasma enhanced TEOS (PETEOS) film, high density plasma enhanced TEOS (HDP) film, or silicon oxide film formed by chemical vapor deposition), a fluorine-doped silicate glass (FSG) insulating film, a boron phosphorus silicate glass (BPSG) film, a silicon oxynitride (SiON) insulating film, a silicon nitride film, a low-dielectric-constant insulating film, and the like can be given.

Figure 1B:
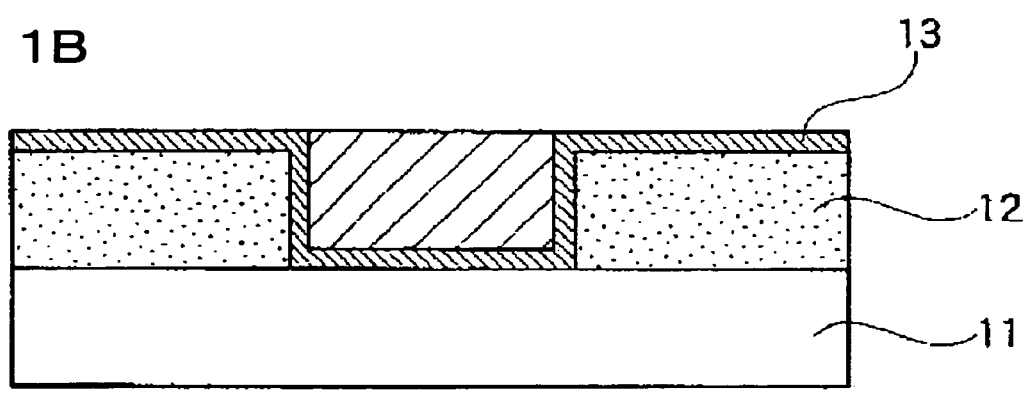
Figure 2B:
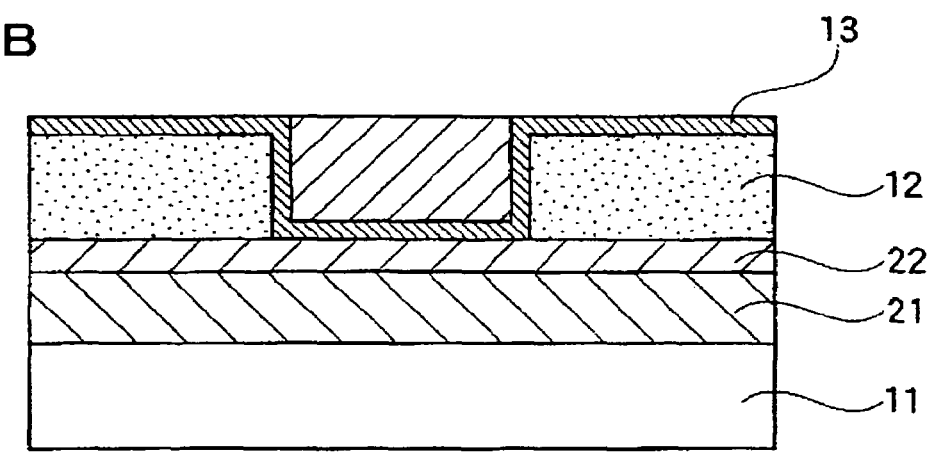

The chemical mechanical polishing method according to one embodiment of the invention fully exerts its effects when using the chemical mechanical polishing method for chemically and mechanically polishing the metal material of the metal film 14 in an area other than the metal wiring provided in the depression for wiring until a predetermined surface (e.g. barrier metal film 13) is exposed (see FIGS. 1B and 2B).

Figure 1C:
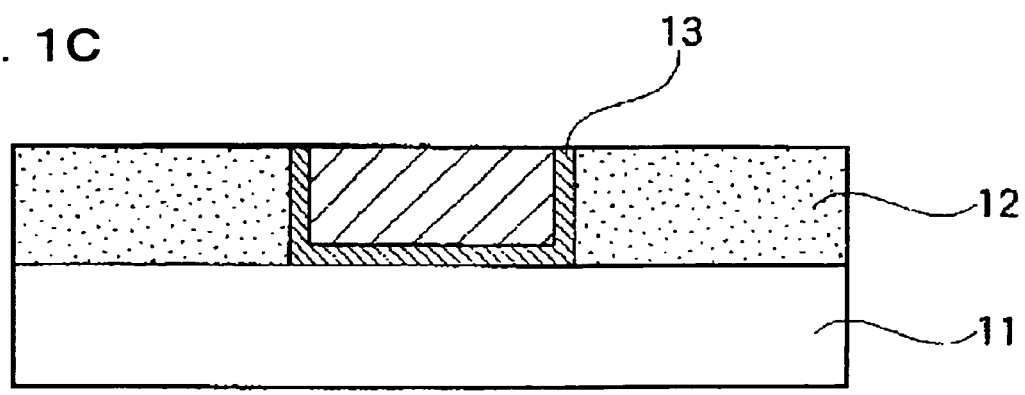
Figure 2C:
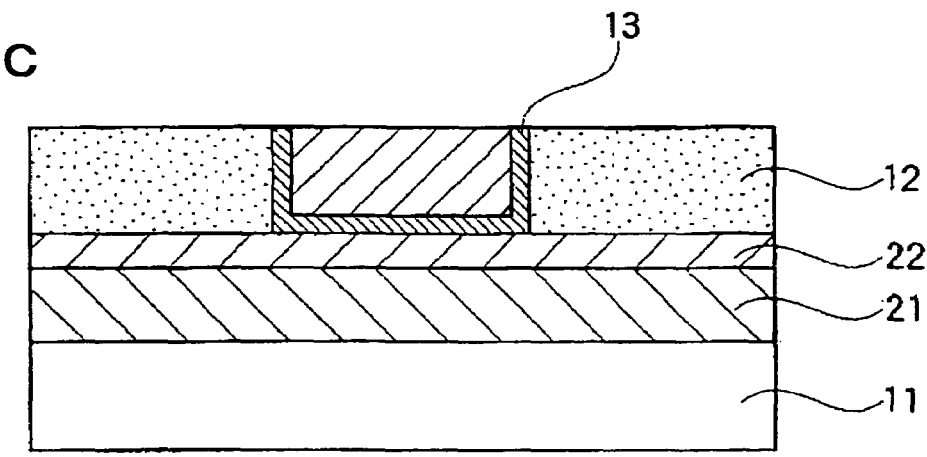

The barrier metal film 13 is then chemically and mechanically polished by a known method so that the barrier metal film formed in the area other than the bottom and the inner wall of the depression for wiring is completely removed, whereby an accurately planarized damascene wiring is formed (see FIGS. 1C and 2C).

In the chemical mechanical polishing method according to one embodiment of the invention, the first polishing step having a high polishing rate and the second polishing step having a polishing rate lower than that of the first polishing step are continuously performed when removing an unnecessary metal wiring material. The first step is switched to the second step when the residual thickness of an unnecessary wiring material is reduced to preferably 0 to 700 nm, and still more preferably to 200 to 500 nm.

A highly planarized high quality polished surface can be obtained efficiently (in a short polishing time) by switching from the first polishing step to the second polishing step at such a timing.

The removal rate of an unnecessary metal wiring material in the second polishing step is preferably 90% or less, more preferably 10 to 80%, and still more preferably 20 to 70% of the removal rate in the first polishing step.

The chemical mechanical polishing aqueous dispersion used in the chemical mechanical polishing method according to one embodiment of the invention is a mixture of the aqueous dispersion (I) and the aqueous solution (II). The polishing rate can be changed between the first polishing step and the second polishing step by changing the mixing ratio of the aqueous dispersion (I) and the aqueous solution (II).

The mixing ratio of the aqueous dispersion (I) and the aqueous solution (II) in the first polishing step and the mixing ratio of the aqueous dispersion (I) and the aqueous solution (II) in the second polishing step differ depending on the aqueous dispersion (I) and the aqueous solution (II) used. For example, the following modes (i) to (iv) may be employed. Note that one embodiment of the invention is not limited to the following modes, which merely illustrate examples of the modes of one embodiment of the invention.

(i) A chemical mechanical polishing method in which the aqueous dispersion (I) includes (A) abrasives and (B) quinolinic acid, the aqueous solution (II) includes (C) a polishing rate improver, and, when the amounts of the aqueous dispersion (I) and the aqueous solution (II) supplied in the first polishing step are respectively denoted by S(I-1) and S(II-1) and the amounts of the aqueous dispersion (I) and the aqueous solution (II) supplied in the second polishing step are respectively denoted by S(I-2) and S(II-2), "S(I-1)/S(II-1)<S(I-2)/S(II-2)" is satisfied.

(ii) A chemical mechanical polishing method in which the aqueous dispersion (I) includes (A) abrasives and (D) an oxidizing agent, the aqueous solution (II) includes (B) quinolinic acid, and, when the amounts of the aqueous dispersion (I) and the aqueous solution (II) supplied in the first polishing step are respectively denoted by S(I-1) and S(II-1) and the amounts of the aqueous dispersion (I) and the aqueous solution (II) supplied in the second polishing step are respectively denoted by S(I-2) and S(II-2), "S(I-1)/S(II-1)<S(I-2)/S(II-2)" is satisfied.

(iii) A chemical mechanical polishing method in which the aqueous dispersion (I) includes (A) abrasives and (B') a compound having a heterocyclic ring (excluding quinolinic acid), the aqueous solution (II) includes (C) a polishing rate improver and (D) an oxidizing agent, and, when the amounts of the aqueous dispersion (I) and the aqueous solution (II) supplied in the first polishing step are respectively denoted by S(I-1) and S(II-1) and the amounts of the aqueous dispersion (I) and the aqueous solution (II) supplied in the second polishing step are respectively denoted by S(I-2) and S(II-2), "S(I-1)/S(II-1)<S(I-2)/S(II-2)" is satisfied.

(iv) A chemical mechanical polishing method in which the aqueous dispersion (I) includes (A) abrasives, (B') a compound having a heterocyclic ring (excluding quinolinic acid), and (D) an oxidizing agent, the aqueous solution (II) includes (C) a polishing rate improver, and, when the amounts of the aqueous dispersion (I) and the aqueous solution (II) supplied in the first polishing step are respectively denoted by S(I-1) and S(II-1) and the amounts of the aqueous dispersion (I) and the aqueous solution (II) supplied in the second polishing step are respectively denoted by S(I-2) and S(II-2), "S(I-1)/S(II-1)<S(I-2)/S(II-2)" is satisfied.

As the abrasives (A) which may be included in the aqueous dispersion (I) in the methods (i) to (iv), at least one type of abrasives selected from the group consisting of inorganic particles, organic particles, and organic-inorganic composite particles can be given.

As examples of the inorganic particles, silica, alumina, titania, zirconia, ceria, and the like can be given. As examples of the silica, fumed silica, silica synthesized by a sol-gel method, colloidal silica, and the like can be given. The fumed silica may be obtained by reacting silicon chloride or the like with oxygen and water in a gaseous phase. The silica synthesized by the sol-gel method may be obtained by hydrolysis and/or condensation of an alkoxysilicon compound as the raw material. The colloidal silica may be obtained by an inorganic colloid method using a raw material purified in advance, for example.

As examples of the organic particles, polyvinyl chloride, styrene (co)polymer, polyacetal, polyester, polyamide, polycarbonate, olefin (co)polymer, phenoxy resin, acrylic (co) polymer, and the like can be given. As examples of the olefin (co)polymer, polyethylene, polypropylene, poly-1-butene, poly-4-methyl-1-pentene, and the like can be given. As examples of the acrylic (co)polymer, polymethyl methacrylate and the like can be given.

The type and the configuration of the organic-inorganic composite particles are not particularly limited insofar as inorganic particles and organic particles as mentioned above are integrally formed in such a manner that the inorganic particles and the organic particles are not easily separated during the chemical mechanical polishing step.

The organic-inorganic composite particles may have one of the following configurations (i) to (iii).

(i) Organic-inorganic composite particles obtained by polycondensation of an alkoxide compound of a metal or silicon in the presence of organic particles. As examples of the alkoxide compound of a metal or silicon, an alkoxysilane, aluminum alkoxide, titanium alkoxide, and the like can be given. The resulting polycondensate may be bonded to a functional group of the organic particle either directly or through an appropriate coupling agent (e.g. silane coupling agent).

(ii) Organic-inorganic composite particles in which organic particles and inorganic particles having zeta potentials of opposite polarities (positive or negative) are bonded through an electrostatic force. In this case, the composite particles may be formed by mixing the organic particles and the inorganic particles in a pH region in which the organic particles and the inorganic particles have zeta potentials of opposite polarities, or may be formed by mixing the organic particles and the inorganic particles in a pH region in which the organic particles and the inorganic particles have zeta potentials of an identical polarity and changing the solution properties to a pH region in which the organic particles and the inorganic particles have zeta potentials of opposite polarities.

(iii) Organic-inorganic composite particles obtained by polycondensation of an alkoxide compound of a metal or silicon in the presence of the composite particles (ii). As the alkoxide compound of a metal or silicon, the alkoxide compound given for the organic-inorganic composite particles (i) may be used.

As the abrasives (A) included in the chemical mechanical polishing aqueous dispersion according to one embodiment of the invention, silica or the organic-inorganic composite particle is preferable.

The impurity metal content in the abrasives (A) is preferably 10 ppm or less, more preferably 5 ppm or less, still more preferably 3 ppm or less, and particularly preferably 1 ppm or less. As examples of the impurity metal, iron, nickel, zinc, and the like can be given.

The average particle diameter of the abrasives (A) is preferably 5 to 1,000 nm, more preferably 7 to 700 nm, and still more preferably 10 to 500 nm. An excellent polished surface can be obtained at an appropriate polishing rate by using the abrasives having an average particle diameter in this range.

The compound (B') having a heterocyclic ring which may be included in the aqueous dispersion (I) in the methods (iii) and (iv) is preferably an organic compound having at least one heterocyclic ring selected from the group consisting of heterocyclic five-membered rings and heterocyclic six-membered rings containing at least one nitrogen atom. As examples of the heterocyclic ring, heterocyclic five-membered rings such as a pyrrole structure, an imidazole structure, and a triazole structure, and heterocyclic six-membered rings such as a pyridine structure, a pyrimidine structure, a pyridazine structure, and a pyrazine structure can be given. The heterocyclic rings may form a condensed ring. Specific examples of such a condensed ring include an indole structure, isoindole structure, benzimidazole structure, benzotriaole structure, quinoline structure, isoquinoline structure, quinazoline structure, cinnoline structure, phthalazine structure, quinoxaline structure, acridine structure, and the like.

It is preferable to use an organic compound having a pyridine structure, quinoline structure, benzimidazole structure, or benzotriaole structure. As such an organic compound, quinaldic acid, benzimidazole, and benzotriazole are preferable, with quinaldic acid being still more preferable.

Note that quinolinic acid is excluded from the compound (B') having a heterocyclic ring.

As the polishing rate improver (C) which may be included in the aqueous solution (II) in the methods (i), (iii), and (iv), at least one polishing rate improver selected from the group consisting of an amino acid, aminopolycarboxylic acid, amine compound, amino alcohol, phosphonic acid, halide ion, thiosulphate ion, and ammonium ion can be given.

As examples of the amino acid, glycine, alanine, glutamic acid, and the like can be given.

As examples of the aminopolycarboxylic acid, ethylenediaminetetraacetic acid and the like can be given.

As examples of the amine compound, ethylenediamine, diethylamine, triethylamine, and the like can be given.

As examples of the amino alcohol, triethanolamine and the like can be given. In particular, it is preferable to use the ammonium ion, amino acid, amine compound, or aminopolycarboxylic acid.

As examples of the oxidizing agent (D) which may be included in the aqueous dispersion (I) in the methods (ii) and (iv) and the aqueous solution (II) in the method (iii), hydrogen peroxide, organic peroxide, permanganic acid compound, bichromic acid compound, halogen acid compound, nitric acid compound, perhalogen acid compound, persulfate, heteropolyacid, and the like can be given.

As examples of the organic peroxide, peracetic acid, perbenzoic acid, tert-butyl hydroperoxide, and the like can be given.

As examples of the permanganic acid compound, potassium permanganate and the like can be given.

As examples of the bichromic acid compound, potassium bichromate and the like can be given.

As examples of the halogen acid compound, potassium iodate and the like can be given.

As examples of the nitric acid compound, nitric acid, iron nitrate, and the like can be given.

As examples of the perhalogen acid compound, perchloric acid and the like can be given.

As examples of the persulfate, ammonium persulfate and the like can be given.

As examples of the heteropolyacid, silicomolybdic acid, silicotungstic acid, and the like can be given.

It is preferable to use hydrogen peroxide, organic peroxide, or persulfate since the decomposition product is harmless.

In the method (i), at least one of the aqueous dispersion (I) and the aqueous solution (II) may include the oxidizing agent (D).

The aqueous dispersion (I) in the methods (i) and (ii) may arbitrarily include the compound (B') having a heterocyclic ring which may be included in the aqueous dispersion (I) in the methods (iii) and (iv) in addition to the above-mentioned components.

In the methods (i) to (iv), the aqueous dispersion (I) and the aqueous solution (II) may include an acid, base, surfactant, water-soluble polymer, or the like in addition to the above-mentioned components.

As examples of the acid, an organic acid and an inorganic acid can be given.

As examples of the organic acid, p-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid, phthalic acid, and the like can be given.

As examples of the inorganic acid, nitric acid, sulfuric acid, phosphoric acid, and the like can be given.

As examples of the base, an organic base and an inorganic base can be given. As examples of the organic base, tetramethyl hydroxide and the like can be given. As examples of the inorganic base, an alkali metal hydroxide can be given. As specific examples of the alkali metal hydroxide, sodium hydroxide, potassium hydroxide, rubidium hydroxide, cesium hydroxide, and the like can be given.

The acid and the base may also be used to adjust the pH of the aqueous dispersion (I) and the aqueous solution (II).

As examples of the surfactant, a cationic surfactant, an anionic surfactant, and a nonionic surfactant can be given.

As examples of the cationic surfactant, an aliphatic amine salt, aliphatic ammonium salt, and the like can be given.

As examples of the anionic surfactant, a carboxylate, sulfonate, sulfate salt, phosphate salt, and the like can be given. As examples of the carboxylate, fatty acid soap, alkyl ether carboxylate, and the like can be given.

As examples of the sulfonate, alkylbenzenesulfonate, alkylnaphthalenesulfonate, a-olefin sulfonate, and the like can be given.

As examples of the sulfate salt, higher alcohol sulfate, alkyl ether sulfate, and the like can be given.

As examples of the phosphate, alkyl phosphate and the like can be given.

As examples of the nonionic surfactant, an ether type surfactant, an ether ester type surfactant, an ester type surfactant, an acetylene type surfactant, and the like can be given.

As examples of the ether type surfactant, a polyoxyethylene alkyl ether and the like can be given.

As examples of the ether ester type surfactant, a polyoxyethylene ether of an glycerol ester and the like can be given.

As examples of the ester type surfactant, a polyethylene glycol fatty acid ester, glycerol ester, sorbitan ester, and the like can be given.

As examples of the acetylene type surfactant, an acetylene alcohol, acetylene glycol, ethylene oxide addition product of acetylene diol, and the like can be given.

As examples of the water-soluble polymer, polyacrylamide, polyacrylic acid, polyvinyl alcohol, polyvinylpyrrolidone, hydroxyethylcellulose, and the like can be given.

The amount of the abrasives (A) used in the aqueous dispersion (I) in the methods (i) to (iv) is preferably 0.01 to 10 wt %, more preferably 0.02 to 8 wt %, and still more preferably 0.1 to 5 wt % of the total amount of the aqueous dispersion.

The amount of the quinolinic acid (B) used in the aqueous dispersion (I) in the method (i) is preferably 0.01 to 10 wt %, more preferably 0.02 to 5 wt %, and still more preferably 0.1 to 2 wt % of the total amount of the aqueous dispersion.

The amount of the quinolinic acid used in the aqueous solution (II) in the method (ii) is preferably 0.01 to 5 wt %, more preferably 0.02 to 4 wt %, and still more preferably 0.05 to 3 wt % of the total amount of the aqueous solution.

The amount of the compound (B') having a heterocyclic ring used in the aqueous dispersion (I) in the methods (iii) and (iv) is preferably 0.01 to 10 wt %, more preferably 0.02 to 5 wt %, and still more preferably 0.1 to 2 wt % of the total amount of the aqueous dispersion.

When the aqueous dispersion (I) in the methods (i) and (ii) includes the compound (B') having a heterocyclic ring, the amount of the compound (B') is preferably 0.01 to 10 wt %, more preferably 0.02 to 5 wt %, and still more preferably 0.1 to 2 wt % of the total amount of the aqueous dispersion.

The amount of the polishing rate improver (C) used in the aqueous solution (II) in the methods (i), (iii), and (iv) is preferably 0.01 to 5 wt %, more preferably 0.02 to 4 wt %, and still more preferably 0.05 to 3 wt % of the total amount of the aqueous solution.

The amount of the oxidizing agent (D) used in the aqueous dispersion (I) in the methods (ii) and (iv) is preferably 0.01 to 5 wt %, more preferably 0.02 to 4 wt %, and still more preferably 0.05 to 1 wt % of the total amount of the aqueous dispersion.

The amount of the oxidizing agent (D) used in the aqueous solution (II) in the method (iii) is preferably 0.01 to 10 wt %, more preferably 0.02 to 8 wt %, and still more preferably 0.05 to 5 wt % of the total amount of the aqueous solution.

When the aqueous dispersion (I) in the method (i) includes the oxidizing agent (D), the amount of the oxidizing agent (D) is preferably 0.01 to 5 wt %, more preferably 0.02 to 4 wt %, and still more preferably 0.05 to 1 wt % of the total amount of the aqueous dispersion.

When the aqueous solution (II) in the method (i) includes the oxidizing agent (D), the amount of the oxidizing agent (D) is preferably 0.01 to 10 wt %, more preferably 0.02 to 8 wt %, and still more preferably 0.05 to 5 wt % of the total amount of the aqueous solution.

When using ammonium persulfate as the oxidizing agent (D), ammonium persulfate functions as the oxidizing agent (D), and ammonium ions produced due to electrolytic dissociation of ammonium persulfate in the aqueous dispersion or the aqueous solution function as the polishing rate improver (C). Therefore, the amount of ammonium persulfate corresponding to the ammonium ions should be calculated as the amount of the polishing rate improver (C).

When the aqueous dispersion (I) in the methods (i) to (iv) includes the surfactant, the amount of the surfactant is preferably 0.5 wt % or less, and still more preferably 0.01 to 5 wt % of the total amount of the aqueous dispersion.

The pH of the aqueous dispersion (I) in the methods (i) to (iv) is preferably 7 to 12.

The pH of the aqueous solution (II) in the methods (i) to (iv) is preferably 3 to 12.

In the chemical mechanical polishing method according to one embodiment of the invention, when the amounts of the aqueous dispersion (I) and the aqueous solution (II) supplied in the first polishing step are respectively denoted by S(I-1) and S(II-1) and the amounts of the aqueous dispersion (I) and the aqueous solution (II) supplied in the second polishing step are respectively denoted by S(I-2) and S(II-2), "S(I-1)/S(II-1)<S(I-2)/S(II-2)" is satisfied. The value "S(I-1)/S(II-1)" in the methods (i) to (iv) is preferably 0.01 to 5, and still more preferably 0.05 to 3. The value "S(I-2)/S(II-2)" in the methods (i) to (iv) is preferably 0.05 or more, and still more preferably 0.2 or more. The second polishing step may be performed using only the aqueous dispersion (I) without supplying the aqueous solution (II).

It suffices that the chemical mechanical polishing aqueous dispersion used in one embodiment of the invention be provided so that the aqueous dispersion (I) and the aqueous solution (II) are separately provided and are integrally mixed during polishing. The mixing method and the mixing time are not particularly limited.

For example, the aqueous dispersion (I) and the aqueous solution (II) may be separately supplied to a polishing system and mixed on a platen. Or, the aqueous dispersion (I) and the aqueous solution (II) may be mixed before entering the polishing system or in the polishing system when supplied through a line, or may be mixed in a mixing tank additionally provided. A line mixer or the like may be used to more uniformly mix the aqueous dispersion (I) and the aqueous solution (II).

The chemical mechanical polishing method according to one embodiment of the invention may be carried out by a known method using a commercially available chemical mechanical polishing system and a commercially available chemical mechanical polishing pad.

For example, when using a chemical mechanical polishing system "EPO112" manufactured by Ebara Corporation, the method according to one embodiment of the invention may be carried out under the following conditions:

Supply rate of chemical mechanical polishing aqueous dispersion (total amount of aqueous dispersion (I) and aqueous solution (II)): preferably 100 to 400 mL/min, and still more preferably 150 to 350 mL/min Platen rotational speed: preferably 30 to 150 rpm, and still more preferably 50 to 130 rpm Polishing head rotational speed: preferably 20 to 150 rpm, and still more preferably 30 to 130 rpm Polishing head pressure: preferably 0.1 to 5 psi, and still more preferably 0.5 to 4 psi The above-described chemical mechanical polishing method according to one embodiment of the invention is capable of providing a high-quality polished surface which exhibits excellent planarity and in which occurrence of surface defects is reduced, and achieves a high polishing rate.

2. EXAMPLE

The chemical mechanical polishing method according to the invention is described below in more detail by way of examples. Note that the chemical mechanical polishing method according to the invention is not limited to the following examples.

2.1. Preparation of Aqueous Dispersion Containing Abrasives

2.1.1. Preparation of Aqueous Dispersion Containing Fumed Silica Particles 2 kg of fumed silica particles ("Aerosil #90" manufactured by Nippon Aerosil Co., Ltd.) were dispersed in 6.7 kg of ion-exchanged water using an ultrasonic mixer, and filtered through a filter having a pore diameter of 5 μm to prepare an aqueous dispersion containing 10 wt % of fumed silica having an average particle diameter of 220 nm.

2.1.2. Preparation of Aqueous Dispersion Containing Colloidal Silica

A 2 L flask was charged with 70 g of 25 wt % aqueous ammonia, 40 g of ion-exchanged water, 175 g of ethanol, and 21 g of tetraethoxysilane. The mixture was heated to 60° C. with stirring at 180 rpm. The mixture was stirred at 60° C. for two hours and then cooled to obtain a colloidal silica/alcohol dispersion having an average particle diameter of 97 nm. An operation of removing the alcohol from the dispersion at 80° C. using an evaporator while adding ion-exchanged water to the dispersion was performed several times to remove the alcohol from the dispersion to prepare an aqueous dispersion containing 10 wt % of colloidal silica having an average particle diameter of 97 nm.

2.1.3. Preparation of Aqueous Dispersion Containing Organic-Inorganic Composite Particles

2.1.3-1. Preparation of Aqueous Dispersion Containing Organic Particles

A 2 L flask was charged with 90 parts by weight of methyl methacrylate, 5 parts by weight of methoxy polyethylene glycol methacrylate ("NK Ester M-90G #400" manufactured by Shin-Nakamura Chemical Co., Ltd.), 5 parts by weight of 4-vinylpyridine, 2 parts by weight of an azo initiator ("V50" manufactured by Wako Pure Chemical Industries, Ltd.), and 400 parts by weight of ion-exchanged water. The mixture was heated to 70° C. with stirring in a nitrogen gas atmosphere and polymerized for six hours. As a result, an aqueous dispersion containing polymethyl methacrylate particles having a functional group containing a cation of an amino group and a polyethylene glycol chain and having an average particle diameter of 150 nm was obtained. The polymerization yield was 95%.

2.1.3-2. Preparation of Aqueous Dispersion Containing Composite Particles

A 2 L flask was charged with 100 parts by weight of the aqueous dispersion containing 10 wt % of the polymethyl methacrylate particles obtained in 2.1.3-1. After the addition of 1 part by weight of methyltrimethoxysilane, the mixture was stirred at 40° C. for two hours. The pH of the mixture was adjusted to 2.0 using nitric acid to obtain an aqueous dispersion (a). The zeta potential of the polymethyl methacrylate particles contained in the aqueous dispersion (a) was +17 mV.

The pH of an aqueous dispersion containing 10 wt % of colloidal silica ("Snowtex O" manufactured by Nissan Chemical Industries, Ltd.) was adjusted to 8.0 using potassium hydroxide to obtain an aqueous dispersion (b). The zeta potential of the silica particles contained in the aqueous dispersion (b) was −40 mV.

50 parts by weight of the aqueous dispersion (b) was slowly added to and mixed with 100 parts by weight of the aqueous dispersion (a) in two hours. The mixture was then stirred four two hours to obtain an aqueous dispersion containing particles in which the silica particles adhered to the polymethyl methacrylate particles. After the addition of 2 parts by weight of vinyltriethoxysilane to the aqueous dispersion, the mixture was stirred for one hour. After the addition of 1 part by weight of tetraethoxysilane, the mixture was heated to 60° C. The mixture was stirred for three hours and then cooled to obtain an aqueous dispersion containing organic-inorganic composite particles. The average particle diameter of the organic-inorganic composite particles was 180 nm. The silica particles adhered to 80% of the surface of the polymethyl methacrylate particle.

2.2. Example 1

2.2.1. Preparation of Aqueous Dispersion (I)

A polyethylene container was charged with the aqueous dispersion containing fumed silica particles prepared in 2.1.1. in such an amount that the amount of fumed silica was 2 wt % of the total amount of the chemical mechanical polishing aqueous dispersion. After the addition of 0.5 wt % of quinaldic acid, the mixture was sufficiently stirred. After the addition of 0.1 wt % of potassium dodecylbenzenesulfonate and ammonium hydroxide as a pH adjusting agent with stirring, the mixture was diluted with ion-exchanged water to obtain a chemical mechanical polishing aqueous dispersion (I) having a pH of 10.0.

2.2.2. Preparation of Aqueous Solution (II)

A polyethylene container was charged with quinolinic acid in an amount of 0.5 wt % of the total amount of the aqueous solution. After the addition of potassium hydroxide (solid) as a pH adjusting agent, a predetermined amount of ion-exchanged water was added. Then, a 30 wt % hydrogen peroxide aqueous solution was added in such an amount that the amount of hydrogen peroxide was 0.2 wt % of the total amount of the aqueous solution to obtain an aqueous solution (II) having a pH of 9.1.

2.2.3. Polishing of Blanket Wafer Having Copper Layer (Evaluation of Copper Film Polishing Rate)

A blanket wafer (unpatterned wafer) having a copper layer as a polishing target was chemically and mechanically polished using the aqueous dispersion (I) and the aqueous solution (II) synthesized as described above under two different conditions given below using a chemical mechanical polishing system "EPO-112" manufactured by Ebara Corporation and a polishing pad "IC 1000-050-(603)-(P)-S400J" manufactured by Nitta Haas Incorporated. The aqueous dispersion (I) and the aqueous solution (II) were separately supplied, and caused to come in contact with each other and mixed on a platen.

2.2.3-1. Conditions 1

Supply rate of aqueous dispersion (I): 50 mL/min
Supply rate of aqueous solution (II): 250 mL/min
Platen rotational speed: 100 rpm
Head rotational speed: 80 rpm
Head load: 140 g/cm$^2$
Polishing time: 60 sec

2.2.3-2. Conditions 2

Supply rate of aqueous dispersion (I): 150 mL/min
Supply rate of aqueous solution (II): 150 mL/min The platen rotational speed, the head rotational speed, the head load, and the polishing time are the same as those of the condition 1.

The removal rate of the copper film was calculated for each wafer treated under the above conditions by dividing the difference in the thickness of the copper film before and after the treatment by the treatment time of the first treatment step. The removal rate of the wafer polished under the conditions 1 was 12,000 Å/min, and the removal rate of the wafer polished under the conditions 2 was 6,000 Å/min. The thickness of the copper film was determined by measuring the sheet resistance by a four point probe method using a resistivity processor ("S-5" manufactured by NPS Inc.) and calculating the thickness of the copper film from the sheet resistance and the theoretical resistivity of copper according the following equation.

$$\text{Thickness of copper film (Å)} = \text{sheet resistance } (\Omega/cm^2) \div \text{theoretical resistivity of copper } (\Omega/cm) \times 10^{-8}$$

2.2.4. Removal of Unnecessary Copper Film from Patterned Wafer

A patterned wafer ("SEMATECH #854" manufactured by International Sematech; test wafer having various wiring patterns; thickness of deposited copper film: 11,000 Å) as a polishing target was chemically and mechanically polished under the conditions 1 (first polishing step) in "Polishing of blanket wafer having copper layer" using the chemical mechanical polishing system and the polishing pad used in "Polishing of blanket wafer having copper layer. The wafer was then chemically and mechanically polished under the conditions 2 (second polishing step). The polishing time of the first polishing step was 45 seconds. In the subsequent second polishing step, overpolishing was performed for 30 seconds after the polishing end point detected by reading a change in torque from the platen current of the chemical mechanical polishing system had been reached.

The thickness of the copper film remaining after the first polishing step was calculated to be 2,000 Å from the removal rate of the copper film calculated by polishing experiments conducted under the condition 1 in "Polishing of blanket wafer having copper layer", the polishing time of the first polishing step, and the initial thickness of copper deposited on the polishing target. Note that the removal rate of the copper film from the unpatterned wafer does not precisely coincide with the removal rate of the copper film from the patterned wafer under the same conditions.

The dishing value in the area having a wiring width of 100 μm was measured for the polished wafer subjected to the above two-step polishing using a high-precision surface profiler ("HRP" manufactured by KLA-Tencor Corporation). As a result, the dishing value was as small as 600 Å. Similarly, the erosion value was measured in the area in which the pattern of a wiring width of 9 μm and a space of 1 μm was continuously formed at a length of 1250 μm in the direction perpendicular to the wiring. As a result, the erosion value was as small as 400 Å.

The copper wiring was observed using a scanning electron microscope. As a result, occurrence of corrosion was not observed.

2.3. Examples 2 to 5

The aqueous dispersion (I) and the aqueous solution (II) were prepared in the same manner as in Example 1 except for changing the types and the amounts of the components of the aqueous dispersion (I) and the aqueous solution (II) as shown in Table 1.

A blanket wafer having a copper layer was polished and an unnecessary copper film was removed from a patterned wafer in the same manner as in Example 1 except for using the resulting aqueous dispersion (I) and aqueous solution (II) and changing the supply rates of the aqueous dispersion (I) and the aqueous solution (II) as shown in Table 2. The results are shown in Table 2. In Example 3, the first polishing step was performed until the polishing end point detected from a change in torque of the polishing system was reached, and the second polishing step was then performed for 30 seconds.

In Examples 2 to 4, ammonia was used as the pH adjusting agent. Ammonia was added as 30 wt % aqueous ammonia. In Example 5, potassium hydroxide was used as the pH adjusting agent. The potassium hydroxide was added in a solid state.

In Table 1, the abbreviation for the surfactant indicates the following compound.
DBS-K: potassium dodecylbenzenesulfonate
DBS-A: ammonium dodecylbenzenesulfonate
SLA: ammonium lauryl sulfate The symbol "-" in Table 1 indicates that the corresponding component was not added.

TABLE 1

|  | Example 1 | | Example 2 | | Example 3 | |
| --- | --- | --- | --- | --- | --- | --- |
|  | Aqueous dispersion (I) | Aqueous solution (I) | Aqueous dispersion (I) | Aqueous solution (II) | Aqueous dispersion (I) | Aqueous solution (II) |
| (A) Abrasives | | | | | | |
| Type | Fumed silica | — | Colloidal silica | — | Colloidal silica | — |
| Amount (wt %) | 2.0 | — | 1.0 | — | 5.0 | — |
| (B) Quinolinic acid | | | | | | |
| Amount (wt %) | — | 0.5 | — | — | 3.0 | — |
| (B') Compound having heterocyclic ring | | | | | | |
| Type | Quinaldinic acid | — | Quinaldinic acid | — | Quinaldinic acid | — |
| Amount (wt %) | 0.5 | — | 1.0 | — | 2.0 | — |
| (C) Polishing rate improver | | | | | | |
| Type | — | — | — | (Ammonium persulfate) | — | Glycine |
| Amount (wt %) | — | — | — | — | — | 0.5 |
| (D) Oxidizing agent | | | | | | |
| Type | — | Hydrogen peroxide | — | Ammonium persulfate | — | Ammonium persulfate |
| Amount (wt %) | — | 0.2 | — | 5.0 | — | 2.0 |
| Surfactant | | | | | | |
| Type | DBS-K | — | DBS-A | — | SLA | — |
| Amount (wt %) | 0.1 | — | 0.2 | — | 0.5 | — |
| pH adjusting agent | | | | | | |
| Type | Potassium hydroxide | Potassium hydroxide | Ammonia | — | Ammonia | — |
| pH | 10.0 | 9.1 | 10.5 | 4.1 | 10.2 | 5.6 |

|  | Example 4 | | Example 5 | |
| --- | --- | --- | --- | --- |
|  | Aqueous dispersion (I) | Aqueous solution (II) | Aqueous dispersion (I) | Aqueous solution (II) |
| (A) Abrasives | | | | |
| Type | Fumed silica | — | Composite particle | — |
| Amount (wt %) | 0.5 | — | 3.0 | — |
| (B) Quinolinic acid | | | | |
| Amount (wt %) | 0.5 | — | — | — |
| (B') Compound having heterocyclic ring | | | | |

TABLE 1-continued

|  | Example 1 | Example 2 | Example 3 | |
|---|---|---|---|---|
| Type | — | — | Quinaldinic acid | — |
| Amount (wt %) | — | — | 1.0 | — |
| (C)Polishing rate improver | | | | |
| Type | — | Ethylenediamine | — | Glycine |
| Amount (wt %) | — | 0.4 | — | 2.0 |
| (D)Oxidizing agent | | | | |
| Type | Hydrogen peroxide | — | Hydrogen peroxide | — |
| Amount (wt %) | 0.2 | — | 0.2 | — |
| Surfactant | | | | |
| Type | DBS-K | — | DBS-A | — |
| Amount (wt %) | 0.1 | — | 0.2 | — |
| pH adjusting agent | | | | |
| Type | Ammonia | — | Potassium hydroxide | — |
| Amount (wt %) | 9.0 | 11.7 | 9.2 | 6.2 |

2.4. Comparative Example 1

Chemical mechanical polishing was performed in the same manner as in "Removal of unnecessary copper film from patterned wafer" of Example 1 under the conditions of the second polishing step without performing the first polishing step. After the polishing end point detected from a change in torque of the chemical mechanical polishing system was reached, overpolishing was performed for 30 seconds.

The dishing value and the erosion value measured in the same manner as in Example 1 were respectively 600 Å and 400 Å, and occurrence of corrosion of the copper wiring was not observed using a scanning electron microscope. However, the polishing time from the start of polishing to the end point was 115 seconds (i.e. the total polishing time was 145 seconds). Therefore, it was confirmed that the method of Comparative Example 1 requires a polishing time longer than that of the method of Example 1.

2.5. Comparative Example 2

Chemical mechanical polishing was performed in the same manner as in "Removal of unnecessary copper film from patterned wafer" of Example 2 under the conditions of the first polishing step without changing the conditions. After the polishing end point detected from a change in torque of the chemical mechanical polishing system was reached, polishing was further performed for 30 seconds.

The dishing value and the erosion value measured in the same manner as in Example 1 were respectively 1,200 Å and 700 Å. The resulting copper wiring was observed using a scanning electron microscope. As a result, occurrence of corrosion was observed.

TABLE 2

|  | Example 1 | Example 2 | Example 3 | Example 4 | Example 5 |
|---|---|---|---|---|---|
| First polishing step | | | | | |
| Supply rate of aqueous dispersion (I) (mL/min) | 50 | 100 | 20 | 150 | 150 |
| Supply rate of aqueous solution (II) (mL/min) | 250 | 200 | 280 | 150 | 150 |
| S(I-1)/S(II-1) | 0.2 | 0.5 | 0.07 | 1.0 | 1.0 |
| Removal rate of copper film from unpatterned wafer (Å/min) | 12,000 | 18,000 | 21,000 | 15,000 | 13,000 |
| Second polishing step | | | | | |
| Supply rate of aqueous dispersion (I) (mL/min) | 150 | 200 | 50 | 250 | 300 |
| Supply rate of aqueous solution (II) (mL/min) | 150 | 100 | 250 | 50 | 0 |
| S(I-2)/S(II-2) | 1.0 | 2.0 | 0.2 | 5.0 | ∞ |
| Removal rate of copper film from unpatterned wafer (Å/min) | 6,000 | 5,500 | 5,500 | 6,000 | 4,000 |
| Polishing of patterned wafer | | | | | |
| First polishing step | | | | | |
| Polishing time (sec) | 45 | 30 | 40 | 35 | 45 |
| Thickness of copper film remaining after first polishing step (calculated | 2,000 | 2,000 | 0 (polished until end | 2,250 | 1,250 |

TABLE 2-continued

|  | Example 1 | Example 2 | Example 3 | Example 4 | Example 5 |
|---|---|---|---|---|---|
| value, Å) |  |  | point was reached) |  |  |
| Second polishing step |  |  |  |  |  |
| Polishing time (until end point, sec) | 23 | 25 | 0 | 30 | 25 |
| Overpolishing time (sec) | 30 | 30 | 30 | 30 | 30 |
| Total polishing time (sec) | 98 | 85 | 70 | 95 | 100 |
| Dishing (Å) | 600 | 300 | 700 | 900 | 550 |
| Erosion (Å) | 400 | 350 | 450 | 500 | 380 |
| Corrosion | None | None | None | None | None |

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A chemical mechanical polishing method, comprising:
chemically and mechanically polishing a polishing target surface by continuously performing a first polishing step and a second polishing step having a polishing rate lower than a polishing rate of the first polishing step, a chemical mechanical polishing aqueous dispersion used in the first polishing step and the second polishing step being a mixture of an aqueous dispersion (I) and an aqueous solution (II), and the polishing rate being changed between the first polishing step and the second polishing step by changing a mixing ratio of the aqueous dispersion (I) and the aqueous solution (II),
wherein the aqueous dispersion (I) comprises (A) abrasives and (B) quinolinic acid;
wherein the aqueous solution (II) comprises (C) a polishing rate improver; and
wherein, when amounts of the aqueous dispersion (I) and the aqueous solution (II) supplied in the first polishing step are respectively denoted by S(I-1) and S(II-1) and amounts of the aqueous dispersion (I) and the aqueous solution (II) supplied in the second polishing step are respectively denoted by S(I-2) and S(II-2) the relationship, S(I-1)/S(II-1)<S(I-2)/S(II-2) is satisfied.

2. The chemical mechanical polishing method as defined in claim 1, wherein the aqueous dispersion (I) further comprises (D) an oxidizing agent.

3. The chemical mechanical polishing method as defined in claim 1, wherein the aqueous solution (II) further comprises (D) an oxidizing agent.

4. A chemical mechanical polishing method, comprising:
chemically and mechanically polishing a polishing target surface by continuously performing a first polishing step and a second polishing step having a polishing rate lower than a polishing rate of the first polishing step, a chemical mechanical polishing aqueous dispersion used in the first polishing step and the second polishing step being a mixture of an aqueous dispersion (I) and an aqueous solution (II), and the polishing rate being changed between the first polishing step and the second polishing step by changing a mixing ratio of the aqueous dispersion (I) and the aqueous solution (II),
wherein the aqueous dispersion (I) comprises (A) abrasives and (D) an oxidizing agent;
wherein the aqueous solution (II) comprises (B) quinolinic acid; and
wherein, when amounts of the aqueous dispersion (I) and the aqueous solution (II) supplied in the first polishing step are respectively denoted by S(I-1) and S(II-1) and amounts of the aqueous dispersion (I) and the aqueous solution (II) supplied in the second polishing step are respectively denoted by S(I-2) and S(II-2), the relationship S(I-1)/S(II-1)<S(I-2)/S(II-2) is satisfied.

5. A chemical mechanical polishing method, comprising:
chemically and mechanically polishing a polishing target surface by continuously performing a first polishing step and a second polishing step having a polishing rate lower than a polishing rate of the first polishing step, a chemical mechanical polishing aqueous dispersion used in the first polishing step and the second polishing step being a mixture of an aqueous dispersion (I) and an aqueous solution (II), and the polishing rate being changed between the first polishing step and the second polishing step by changing a mixing ratio of the aqueous dispersion (I) and the aqueous solution (II),
wherein the aqueous dispersion (I) comprises (A) abrasives and (B') a compound having a heterocyclic ring excluding quinolinic acid;
wherein the aqueous solution (II) comprises (C) a polishing rate improver and (D) an oxidizing agent; and
wherein, when amounts of the aqueous dispersion (I) and the aqueous solution (II) supplied in the first polishing step are respectively denoted by S(I-1) and S(II-1) and amounts of the aqueous dispersion (I) and the aqueous solution (II) supplied in the second polishing step are respectively denoted by S(I-2) and S(II-2), the relationship S(I-1)/S(II-1)<S(I-2)/S(II-2) is satisfied.

6. A chemical mechanical polishing method, comprising:
chemically and mechanically polishing a polishing target surface by continuously performing a first polishing step and a second polishing step having a polishing rate lower than a polishing rate of the first polishing step, a chemical mechanical polishing aqueous dispersion used in the first polishing step and the second polishing step being a mixture of an aqueous dispersion (I) and an aqueous solution (II), and the polishing rate being changed between the first polishing step and the second polishing step by changing a mixing ratio of the aqueous dispersion (I) and the aqueous solution (II),
wherein the aqueous dispersion (I) comprises (A) abrasives, (B') a compound having a heterocyclic ring excluding quinolinic acid, and (D) an oxidizing agent;

wherein the aqueous solution (II) comprises (C) a polishing rate improver; and wherein, when amounts of the aqueous dispersion (I) and the aqueous solution (II) supplied in the first polishing step are respectively denoted by S(I-1) and S(II-1) and amounts of the aqueous dispersion (I) and the aqueous solution (II) supplied in the second polishing step are respectively denoted by S(I-2) and S(II-2), the relationship S(I-1)/S(II-1)<S(I-2)/S(II-2) is satisfied.

* * * * *